(12) United States Patent
Marukawa

(10) Patent No.: US 6,458,675 B1
(45) Date of Patent: Oct. 1, 2002

(54) SEMICONDUCTOR DEVICE HAVING A PLASMA-PROCESSED LAYER AND METHOD OF MANUFACTURING THE SAME

(75) Inventor: Takashi Marukawa, Shiga-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/460,613

(22) Filed: Dec. 14, 1999

Related U.S. Application Data

(62) Division of application No. 08/652,824, filed on May 23, 1996, now abandoned.

(30) Foreign Application Priority Data

May 25, 1995 (JP) .............................. 7-126395

(51) Int. Cl.[7] .............................................. H01L 21/28
(52) U.S. Cl. ........................ 438/571; 438/46; 438/172; 438/507; 438/509
(58) Field of Search .................... 438/46, 172, 507, 438/509, 571

(56) References Cited

U.S. PATENT DOCUMENTS

| | | | |
|---|---|---|---|
| 4,610,731 A | | 9/1986 | Chevallier et al. .......... 438/518 |
| 4,961,194 A | * | 10/1990 | Kuroda et al. .............. 257/192 |
| 5,118,637 A | * | 6/1992 | Ishikawa .................... 438/172 |
| 5,141,879 A | * | 8/1992 | Goronki et al. ............. 438/172 |
| 5,144,379 A | * | 9/1992 | Eshita et al. ................ 257/190 |
| 5,180,681 A | * | 1/1993 | Mishra et al. .............. 438/167 |
| 5,276,340 A | * | 1/1994 | Yokoyama et al. ......... 257/194 |
| 5,371,382 A | | 12/1994 | Venkatesan et al. .......... 257/77 |
| 5,411,914 A | * | 5/1995 | Chen et al. ................. 438/167 |
| 5,426,068 A | * | 6/1995 | Imaizumi et al. ........... 438/509 |
| 5,552,330 A | * | 9/1996 | Tehrani et al. ............. 438/172 |
| 5,571,339 A | | 11/1996 | Ringel et al. ............... 136/252 |
| 5,571,748 A | * | 11/1996 | Miyazawa et al. ............ 438/46 |
| 5,622,891 A | * | 4/1997 | Saito .......................... 438/172 |
| 5,663,075 A | * | 9/1997 | Robinson ..................... 438/92 |
| 5,834,362 A | * | 11/1998 | Miyagaki et al. ........... 438/507 |
| 6,033,929 A | * | 3/2000 | Murakami et al. ............ 438/46 |

FOREIGN PATENT DOCUMENTS

| | | | | |
|---|---|---|---|---|
| EP | 437702 | | 7/1991 | |
| EP | 642175 | | 3/1995 | |
| EP | 0642175 A1 | * | 3/1995 | ......... H01L/29/812 |
| WO | 9323877 | | 11/1993 | |

OTHER PUBLICATIONS

Manasreh, M.O., et al., "Observation of deep defects in As–rich GaAs grown by the molecular beam epitaxy technique at 200° C.", *Semi Insulating III–V (3–5) Materials*, Toronto, May 13–16, 1990, No. Conf. 6, Jan. 1, 1990, pp. 105–110.

A. Paccagnella, et al., "Schottky diodes on hydrogen plasma treated n–GaAs surfaces", *Applied Physics Letters*, vol. 55, No. 3, Jul. 17, 1989, pp. 259–261.

Liliental–Weber, Z., et al., "Arsenic implantation into GaAs: a SOI technology for compound semiconductors?", *Ultramicroscopy*, vol. 52, No. 3/04, Dec. 1993, pp. 570–574.

*Patent Abstracts of Japan*, vol. 005, No. 091 (E–061), Jun. 13, 1981 & JP 56–036170, Apr. 9, 1981.

* cited by examiner

*Primary Examiner*—Eddie Lee
*Assistant Examiner*—José R Díaz
(74) *Attorney, Agent, or Firm*—Ostrolenk, Faber, Gerb & Soffen, LLP

(57) ABSTRACT

A semiconductor device includes: a semiconductor substrate; an active layer; and a plasma-processed layer provided between the semiconductor substrate and the active layer. The plasma-processed layer has a deep level. First and second electrodes are electrically connected by ohmic contact with first and second portions of the active layer, respectively. The first and second portions are spaced apart at a predetermined interval from each other. A third electrode is formed on a third respective portion of the active layer and is located between the first and second portions of the active layer.

13 Claims, 2 Drawing Sheets

SEMICONDUCTOR DEVICE HAVING A PLASMA-PROCESSED LAYER AND METHOD OF MANUFACTURING THE SAME

This is a divisional of application Ser. No. 08/652,824, filed May 23, 1996 now abandoned.

BACKGROUND OF THE INVENTION

The present invention relates to a semiconductor device and a method of manufacturing the same.

In general, the mobility of electrons in a low electrical field is higher in a compound semiconductor than in Si. This means that the speed of electrons moving in a compound semiconductor can be higher than in Si. Therefore, a compound semiconductor is suitable for micro-wave and millimeter-wave devices and high power devices. More particularly, field effect transistors having a Schottky junction gate utilizing gallium arsenide (GaAs), which is a typical material for compound semiconductors (hereinafter referred to as a "GaAs MESFET"), are under active research and development for reduced noise and increased power and are widely used as microwave devices.

FIG. 3 is a sectional view showing the configuration of a conventional field effect transistor (referred to as an "FET"). The FET shown in FIG. 3 is a GaAs MESFET in which a buffer layer 113 made of, for example, non-doped GaAs or AlGaAs is formed on a semiconductor substrate 110 made of semi-insulating gallium arsenide, and an n-type active layer 111 is formed on the buffer layer 113. A gate electrode 101, a source electrode 102, and a drain electrode 103 are formed on the surface of the active layer 111. If the buffer layer 113 were not formed, a defect level of a very high density would be introduced at the interface between the n-type active layer 111 and the semiconductor substrate 110. This would reduce mutual conductance $g_m$ and would result in generation of hysteresis in a current-voltage curve.

The conventional FET shown in FIG. 3, nevertheless, has surface defect states of a high density at the interface between the active layer 111 and the buffer layer 113 or between the buffer layer 113 and the semiconductor substrate 110, or both. Also, electric potential changes abruptly at the interface. Therefore, the conventional FET has had a problem in that the breakdown voltages of the drain and gate cannot be made higher, because a leakage current at the interface under biased conditions is likely to be caused by the abrupt change in potential and the existence of the surface defect states.

In addition, the gate electrode 101 is usually biased to some degree with respect to the semiconductor substrate 110 during the operation of the FET, which may cause an electric current to flow between the gate electrode 101 and the semiconductor substrate 110. Therefore, electrons or holes flow from the active layer 111 to the buffer layer 113 during the operation of the FET and result in formation of a depletion region which extends from the surface of the active layer 111 facing the buffer layer 113 to the inside of the active layer 111. Since such a depletion region causes a change in potential in the active layer 111, the formation of such a depletion region acts as a gate. That is, the so-called back gate effect occurs. As a result, there arises a problem that the conductivity of the active layer 111 under the gate electrode 101 changes and the drain current is distorted.

SUMMARY OF THE INVENTION

It is an object of the present invention to provide a semiconductor device and a method of manufacturing the same wherein the above-described problems are solved and wherein the breakdown voltages of the gate and drain can be made higher, and the distortion of the output signal relative to the input signal can be made smaller, as compared to the prior art.

According to preferred embodiments of the invention, a semiconductor device includes: a semiconductor substrate; an active layer; and a plasma-processed layer provided between the semiconductor substrate and the active layer. The plasma-processed layer has a deep defect level. First and second electrodes are electrically connected by ohmic contact with first and second portions of the active layer, respectively. The first and second portions are spaced apart at a predetermined interval from each other. A third electrode is formed on a third portion of the active layer, the third portion being located between the first and second portions of the active layer.

According to another aspect of the preferred embodiments of the present invention, a method of manufacturing a semiconductor device includes the steps of: exposing a surface of a semiconductor layer to a plasma such that a plasma-processed layer is formed at a surface region of the semiconductor layer; epitaxially growing an active layer on the plasma-processed layer; and providing at least one electrode on the active layer, the electrode being electrically in contact with the active layer.

In one preferred embodiment, the semiconductor device further includes a buffer layer between the semiconductor substrate and the plasma-processed layer.

According to a feature of the preferred embodiments, the deep defect level of the plasma-processed layer has an energy of about 0.6 to 0.8 eV.

According to another feature, the deep level is induced in the plasma-processed layer at a density of about $1 \times 10^{14}$ $cm^{-3}$.

According to another feature, the plasma-processed layer is made of non-doped semiconductor.

According to another feature, the deep level traps electrons.

According to another feature, the semiconductor device is a metal semiconductor field effect transistor.

In the semiconductor device, the plasma-processed layer having deep defect levels of a high density is formed between said semiconductor substrate and the active layer. Since the deep level can trap electrons, electrons which move from the active layer toward the semiconductor substrate during the operation of the FET are trapped by the deep level. Therefore, the plasma-processed layer acts as a high-resistance layer and prevents a current from flowing from the active layer 11 toward the semiconductor substrate. This enables a gradual change in the electric potential at the interface between the active layer and the plasma-processed layer. Therefore, this reduces leakage current at said interface and improves the breakdown voltages of the gate and drain. Further, the back gate effect is reduced, which suppresses the modulation of the drain current. As a result, the distortion of the output signal relative to the input signal can be reduced.

For the purpose of illustrating the invention, there are shown in the drawings several forms which are presently preferred, it being understood, however, that the invention is not limited to the precise arrangements and instrumentalities shown.

Other features and advantages of the present invention will become apparent from the following description of embodiments of the invention which refers to the accompanying drawings.

DETAILED DESCRIPTION OF EMBODIMENTS OF THE INVENTION

Hereinafter, preferred embodiments of the present invention are explained in detail with reference to the drawings.

Figure 1:
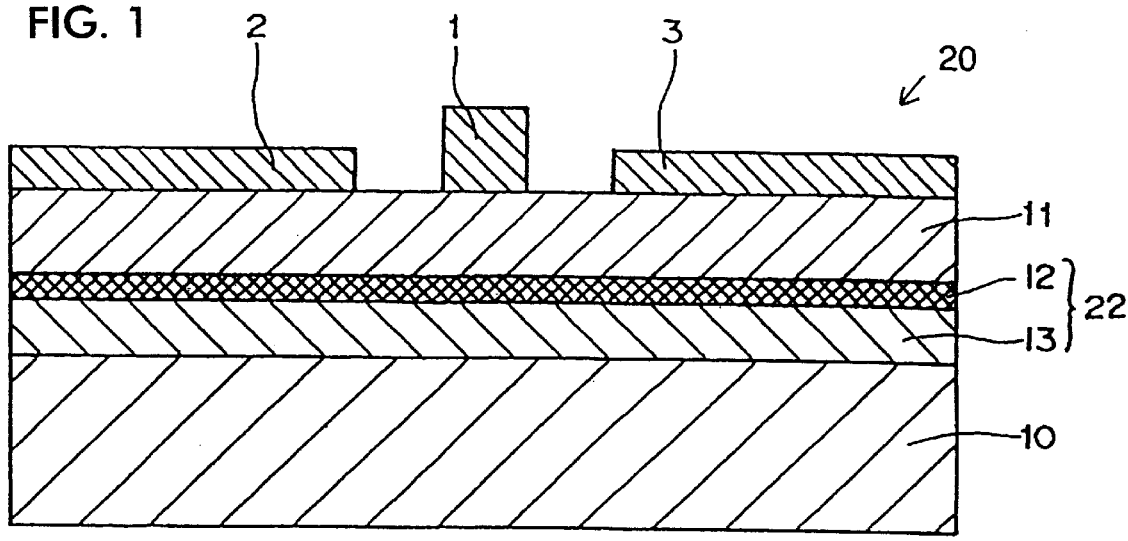
FIG. 1 is a sectional view of a field effect transistor according to an embodiment of the present invention.

FIG. 1 is a sectional view of a FET 20 according to an embodiment of the present invention. The FET 20 includes a semiconductor substrate 10 made of semi-insulating GaAs. The FET 20 further includes a buffer layer 13 provided on the semiconductor substrate 10, an active layer 11, and a plasma-processed layer 12 interposed between the buffer layer 13 and the active layer 11. A source electrode 2 and a drain electrode 3 are provided on the active layer and a gate electrode 1 is provided on the active layer 11 between the source electrode 2 and the drain electrode 3. The source electrode 2 and the drain electrode 3 are in ohmic contact with the active layer 11 while the gate electrode 1 is in Schottky contact with the active layer 11.

Hereinafter, a method for producing the FET 20 will be explained in detail with reference to FIG. 1.

First, a non-doped GaAs layer 22, which is later to become the buffer layer 13 and the plasma-processed layer 12, is formed on the semiconductor substrate 10 by an epitaxial method, such as molecular beam epitaxy, metal organic chemical vapor deposition, or the like. Then, the surface of the non-doped GaAs layer 22 is subjected to a plasma process using reactive ion etching under the following conditions.

(1) oxygen gas ($O_2$) pressure: 50 mTorr
(2) oxygen gas ($O_2$) flow rate: 10 $cm^3$/min
(3) self-bias voltage: a voltage in the range from 120 V to 240 V As a result of the plasma process, the plasma-processed layer 12 is formed in a surface region of the non-doped GaAs layer 22 and the remaining portion of the non-doped GaAs layer 22 becomes a buffer layer 13. Since the plasma process does not cause the impurity concentration of the plasma-processed layer 12 to change, the plasma-processed layer 12 is substantially non-doped.

A plasma process under the above-described conditions allows the As/Ga molar ratio in the vicinity of the surface of said plasma-processed layer to be higher than that achievable when no plasma process is performed. This feature will be explained later in detail. This results in the formation of a deep level (state) in the surf ace region of the plasma layer 12 with a level density of about $1 \times 10^{14}$ $cm^{-3}$. The term "deep level" is used herein to mean a surf ace level located substantially in the middle of an energy gap between the conduction band of the active layer 11 and the valence band of the active layer 11. The deep level has a potential energy of about 0.6 to 0.3 eV measured from the edge of the conduction band. This value is larger than that of the surface defect level which is usually formed on an exposed surface of a GaAs layer, i.e., the deep level is deeper than the surface defect level. The surface level can be measured using ICTS (isothermal capacitance transient spectroscopy).

Next, the active layer 11 made of n-type GaAs is formed on the surface of the plasma-processed layer 12 by means of crystal growth. If the surface of the plasma-processed layer 12 is covered with an oxide layer, it is preferable that the oxide layer is removed by a wet etching before forming the active layer. The active layer 11 is doped with Si ions and has an impurity concentration of about $2 \times 10^{17}$ $cm^{-3}$.

Then, the source electrode 2 and the drain electrode 3 are formed on the active layer 11 so that they face each other at a predetermined interval in the middle of the active layer 11. The source electrode 2 and the drain electrode 3 are made of an Au-Ge/Ni type metal. They are alloyed at a predetermined temperature after being formed on the active layer 11 and are formed so that they are each put in ohmic contact with the active layer 11.

Then, the gate electrode 1 having a predetermined length and a predetermined width is formed on the surface of said active layer 1 between the source electrode 2 and the drain electrode 3. The gate electrode 1 is formed at predetermined intervals from the source electrode 2 and the drain electrode 3 and so that it is bonded to the surface of the active layer 11 so as to make a Schottky contact. Thus, the FET 20 is completed.

In the FET of the present embodiment having the above-described configuration, when A voltage is applied between the source electrode 2 and the drain electrode 3, a source-drain current flows from the drain electrode 3 to the source electrode 2 through the active layer 11 under the gate electrode 1. When a voltage signal is applied to the gate electrode 1 in this state, the thickness of a depletion layer in the active layer 11 located directly under the gate electrode 1 changes in accordance with changes in the amplitude of the voltage of the voltage signal, and this results in changes in the source-drain current. This is a well-known amplifying operation.

During such a normal operation, the FET 20 can overcome the problems associated with conventional FETs because the plasma-processed layer 12 having a deep level of a high density is formed between the buffer layer 13 and the active layer 11. More specifically, since the deep level can trap electrons, electrons which move from the active layer 11 toward the semiconductor substrate 10 during the operation of the FET 20 are trapped by the deep level. Therefore, the plasma-processed layer 12 acts as a high-resistance layer and prevents a current from flowing from the active layer 11 toward the semiconductor substrate 10. This also results in substantially no change in electric charge in the active layer 11 and prevents a depletion region from being generated in the active layer 11 facing the semiconductor substrate 10. This enables a gradual change in the electric potential at the interface between the active layer 11 and the plasma-processed layer 12.

As a result, leakage current at the interface between the active layer 11 and the plasma-processed layer 12 is reduced, which allows the gate and drain breakdown voltages to be higher than those in the case wherein the plasma-processed layer 12 is not formed. Further, the back gate effect caused by the generation of charge is suppressed, which suppresses the modulation of the conductivity of the drain current. As a result, the distortion of the drain current and hence the distortion of the output signal relative to the input signal can be smaller than what occurs in the case wherein the plasma-processed layer 12 is not formed.

Figure 2:
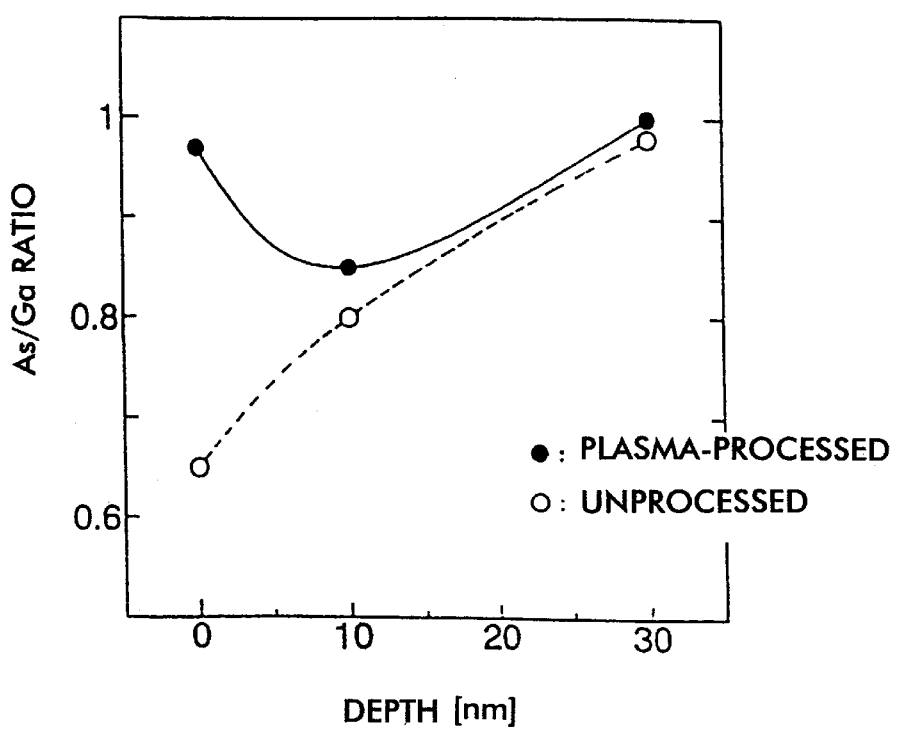
FIG. 2 is a graph showing the As/Ga molar ratio versus depth, in the plasma-processed layer 12 in FIG. 1.
Figure 3:
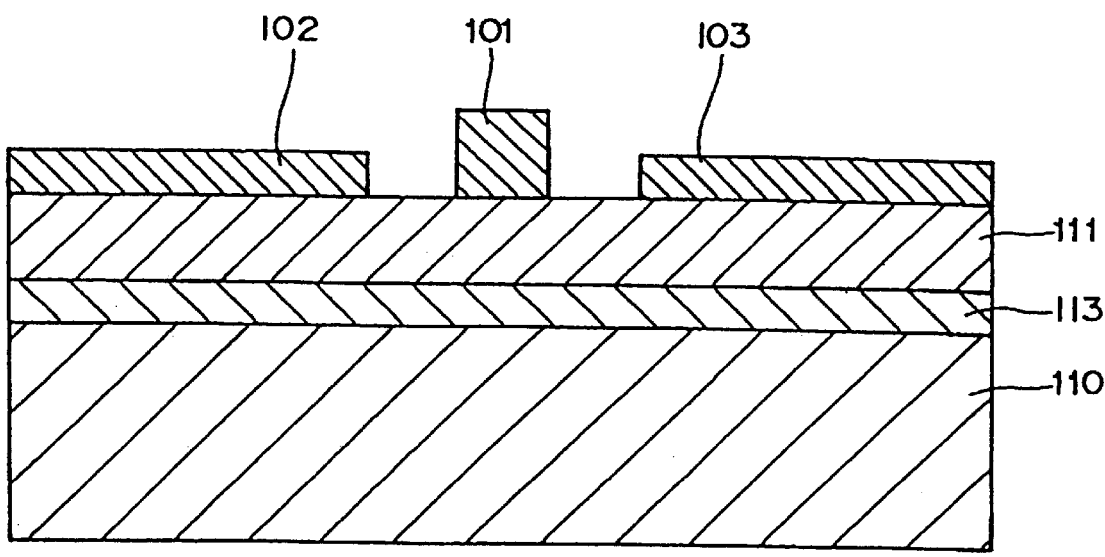
FIG. 3 is a sectional view of a conventional field effect transistor.

FIG. 2 is a graph illustrating the result of an analysis of the As/Ga molar ratio of the plasma-processed layer 12. In FIG. 2, a solid curve represents the result of the measurement of the As/Ga molar ratio carried out from the upper surface of the plasma-processed layer 12 in the direction of the thickness thereof. The dotted curve represents the results of the measurement performed on a conventional buffer layer whose surface has not been subjected to a plasma process. The horizontal axis represents the depth from the upper surface of the plasma-processed layer 12 while the vertical axis represents the As/Ga molar ratio. As apparent from FIG. 2, the As/Ga molar ratio of the preferred embodiment is greater than that of the conventional example in the range from the surface to a depth of about 10 nm. This result indicates that the deep level is induced by arsenic-rich defects.

In the aforementioned preferred embodiment, non-doped GaAs is used as the material of the buffer layer 13 and the plasma-processed layer 12. However, the preferred embodiments of the present invention are not limited thereto, and aluminum gallium arsenide (AlGaAs) may be used. Such a configuration results in the same operation and advantages as in the embodiment.

Although a buffer layer 13 is formed and a plasma process is performed on the surface of the buffer layer 13 in the above-described embodiment, the present invention is not limited thereto, and a plasma process may be performed directly on the surface of the semiconductor substrate 10. In this case, the FET includes a semiconductor substrate, an active layer and a plasma-processed layer interposed between the semiconductor substrate and the active layer. A buffer layer may be formed between the plasma processed layer and the active layer. Such a configuration results in the same operation and advantages as in the embodiment.

Although oxygen gas ($O_2$) is used as the plasma source gas in the above-described embodiment, the present invention is not limited thereto, and plasma sources such as nitrogen gas ($N_2$), argon gas (Ar), tetrafluoromethane ($CF_4$), trifluoromethane ($CHF_3$), and hydrogen gas ($H_2$) may be used. Further, a combination of a plurality of those kinds of gasses may be used as the plasma source. Such a configuration results in the same operation and advantages as in the embodiment.

Although a plasma layer 12 is formed on a buffer layer 13 of a GaAs MESFET in the above-described embodiment, the preferred embodiment of the present invention is not limited thereto, and can apply to a Schottky barrier diode or a high electron mobility transistor (HEMT). Such a configuration results in the same operation and advantages as in the embodiment.

A source electrode 2 and a drain electrode 3 are formed on the surface of an active layer 11. However, a high density layer having an impurity density higher than the impurity density of the active layer 11 may be formed in the areas where the source electrode 2 and the drain electrode 3 are formed and the source and drain electrodes may be formed on the high density layer. Such a configuration results in the same operation and advantages as in the embodiment, and the ohmic contact resistance between the source and drain electrodes and the high density layer can be smaller than the ohmic contact resistance between the source electrode 2 and the drain electrode 3 and the active layer 11.

Although a semiconductor substrate 10 made of GaAs is used in the above-described embodiment, other compound semiconductor materials such as InP or other semiconductor materials such as Si may be used. Such a configuration results in the same operation and advantages as in the embodiment.

While preferred embodiments of the invention have been disclosed, various modes of carrying out the principles disclosed herein are contemplated as being within the scope of the following claims. Therefore, it is understood that the scope of the invention is not to be limited except as otherwise set forth herein.

What is claimed is:

1. A method of manufacturing a semiconductor device, comprising the steps of:

exposing a surface of a semiconductor layer to a plasma such that a plasma-processed layer is formed at a surface region of the semiconductor layer;

epitaxially growing an active layer on the plasma-processed layer; and providing at least one electrode so as to be in ohmic contact with or in Schottky contact with the active layer;

wherein an As/Ga molar ratio of the plasma-processed layer first decreases in a direction from a top surface of the plasma-processed layer toward an opposite surface thereof, and increases again afterwards.

2. A method for manufacturing a semiconductor device according to claim 1, wherein the exposing step is performed such that a deep level is induced in the plasma-processed layer.

3. A method for manufacturing a semiconductor device according to claim 2, wherein the deep level has an energy of about 0.6 to 0.8 eV.

4. A method for manufacturing a semiconductor device according to claim 3, wherein the deep level is induced in the plasma-processed layer at a density of about $1 \times 10^{14}$ $cm^{-3}$.

5. A method for manufacturing a semiconductor device according to claim 1, wherein the semiconductor layer is made of a non-doped semiconductor material.

6. A method for manufacturing a semiconductor device according to claim 1, wherein the semiconductor layer is a semiconductor substrate.

7. A method for manufacturing a semiconductor device according to claim 1, wherein the semiconductor layer is a buffer layer formed on a semiconductor substrate.

8. A method for manufacturing a semiconductor device according to claim 1, further comprising the step of epitaxially growing a buffer layer between the plasma-processed layer and the active layer.

9. A method for manufacturing a semiconductor device according to claim 1, wherein the semiconductor device is a field effect transistor.

10. A method for manufacturing a semiconductor device according to claim 1, wherein the semiconductor device is a Schottky barrier diode.

11. A method for manufacturing a semiconductor device according to claim 1, wherein the plasma is generated by using a gas selected from the group consisting of $O_2$, $N_2$, Ar, $CF_4$, $CHF_3$, and $H_2$.

12. A method for manufacturing a semiconductor device according to claim 2, wherein the deep level traps electrons.

13. A method for manufacturing a semiconductor device according to claim 1, wherein an entire surface of the semiconductor layer is exposed to the plasma such that the plasma-processed layer is formed at an entire surface region of the semiconductor layer.

* * * * *